United States Patent
Romano et al.

(10) Patent No.: US 9,761,757 B2
(45) Date of Patent: Sep. 12, 2017

(54) III-NITRIDE NANOWIRE LED WITH STRAIN MODIFIED SURFACE ACTIVE REGION AND METHOD OF MAKING THEREOF

(71) Applicant: GLO AB, Lund (SE)

(72) Inventors: Linda Romano, Sunnyvale, CA (US); Sungsoo Yi, Sunnyvale, CA (US); Patrik Svensson, Palo Alto, CA (US); Nathan Gardner, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/060,950

(22) Filed: Mar. 4, 2016

(65) Prior Publication Data
US 2016/0260866 A1  Sep. 8, 2016

Related U.S. Application Data

(63) Continuation of application No. 14/570,521, filed on Dec. 15, 2014, now Pat. No. 9,281,442.
(Continued)

(51) Int. Cl.
*H01L 51/42* (2006.01)
*H01L 33/06* (2010.01)
(Continued)

(52) U.S. Cl.
CPC .............. *H01L 33/06* (2013.01); *H01L 27/15* (2013.01); *H01L 27/153* (2013.01);
(Continued)

(58) Field of Classification Search
CPC .............. H01L 51/057; H01L 51/4266; H01L 29/0669; H01L 21/02603; H01L 21/02606
See application file for complete search history.

(56) References Cited

U.S. PATENT DOCUMENTS 8,138,493 B2  3/2012  Ohlsson et al.
9,054,233 B2  6/2015  Ohlsson et al.
(Continued)

FOREIGN PATENT DOCUMENTS

EP  2297785A0 A  1/2010
JP  10-215029  8/1998
(Continued)

OTHER PUBLICATIONS

International Preliminary Report or Patentability and Written Opinion of the International Searching Authority for International Application No. PCT/US2014/070347, dated Jun. 30, 2016, 8 pages.
(Continued)

*Primary Examiner* — Jae Lee
(74) *Attorney, Agent, or Firm* — The Marbury Law Group PLLC

(57) ABSTRACT

A light emitting diode (LED) device includes a semiconductor nanowire core, and an In(Al)GaN active region quantum well shell located radially around the semiconductor nanowire core. The active quantum well shell contains indium rich regions having at least 5 atomic percent higher indium content than indium poor regions in the same shell. The active region quantum well shell has a non-uniform surface profile having at least 3 peaks. Each of the at least 3 peaks is separated from an adjacent one of the at least 3 peaks by a valley, and each of the at least 3 peaks extends at least 2 nm in a radial direction away from an adjacent valley.

20 Claims, 9 Drawing Sheets

Related U.S. Application Data

(60) Provisional application No. 61/917,046, filed on Dec. 17, 2013.

(51) Int. Cl.
*H01L 33/20* (2010.01)
*H01L 27/15* (2006.01)
*H01L 33/00* (2010.01)
*H01L 33/12* (2010.01)
*H01L 33/24* (2010.01)
*H01L 33/32* (2010.01)
*H01L 33/42* (2010.01)

(52) U.S. Cl.
CPC ...... *H01L 33/0025* (2013.01); *H01L 33/0075* (2013.01); *H01L 33/12* (2013.01); *H01L 33/20* (2013.01); *H01L 33/24* (2013.01); *H01L 33/32* (2013.01); *H01L 33/42* (2013.01); *H01L 2933/0016* (2013.01)

(56) References Cited

U.S. PATENT DOCUMENTS

| | | |
|---|---|---|
| 9,281,442 B2 | 3/2016 | Romano et al. |
| 2010/0006817 A1 | 1/2010 | Ohlsson et al. |
| 2010/0193015 A1 | 8/2010 | Cha et al. |
| 2010/0276664 A1 | 11/2010 | Hersee |
| 2011/0132002 A1* | 6/2011 | Lee .................. B82Y 10/00 62/3.7 |
| 2011/0165466 A1 | 7/2011 | Zhamu et al. |
| 2011/0309382 A1 | 12/2011 | Lowgren |
| 2012/0225526 A1 | 9/2012 | Hersee et al. |
| 2013/0016452 A1 | 1/2013 | Gardner et al. |
| 2013/0140521 A1 | 6/2013 | Gilet et al. |
| 2013/0221322 A1* | 8/2013 | Ohlsson ............. B82Y 10/00 257/13 |
| 2014/0012224 A1 | 1/2014 | Zhang et al. |

FOREIGN PATENT DOCUMENTS

| | | |
|---|---|---|
| JP | 10-215029 | 11/1998 |
| JP | 2009-105088 | 5/2005 |
| KR | 10-2009-0096704 | 9/2009 |
| KR | 10-2012-0052651 A | 5/2012 |
| KR | 10-2012-0059064 | 6/2012 |

OTHER PUBLICATIONS

Chen, H. et al., "Spontaneous Formation of Indium-Rich Nanostructures on InGaN(0001) Surfaces," Carnegie Mellon University, Department of Physics, Physical Review Letters, vol. 85, 10 sheets, (2000).

Detchprohm, T. et al., "Wavelength-Stable Cyan and Green Light Emitting Diodes on Nonpolar m-Plane GaN Bulk Substrates," Applied Physics Letters, vol. 96, pp. 051101-1 to 051101-3, (2010).

International Search Report and Written Opinion, International Application No. PCT/US2014/070347; issued Mar. 30, 2015.

M. Tchernycheva, et al.,"InGaN/GaN Core-Shell Single Nanowire Light Emitting Diodes with Graphene-Based P-Contact," Nano Letters, 14, 2014, pp. 2456-2465.

The Extended European Search Report for EP Application No. 14872419.8 (PCT/US20141070347), issued Apr. 17, 2017, 9 pages.

Barettin, D., et al., "Realistic Model of LED Structure with InGaN Quantum-Dots Active Region," Proceedings of the 15th IEEE International Conference on Nanotechnology, pp. 1543-1546, XP032853887, Jul. 27, 2015.

\* cited by examiner

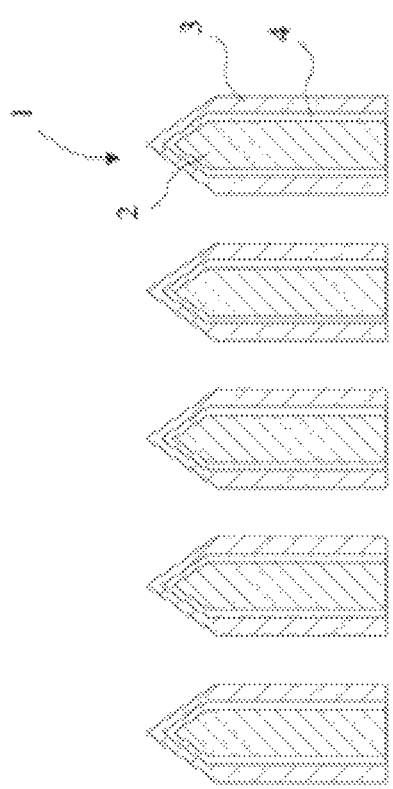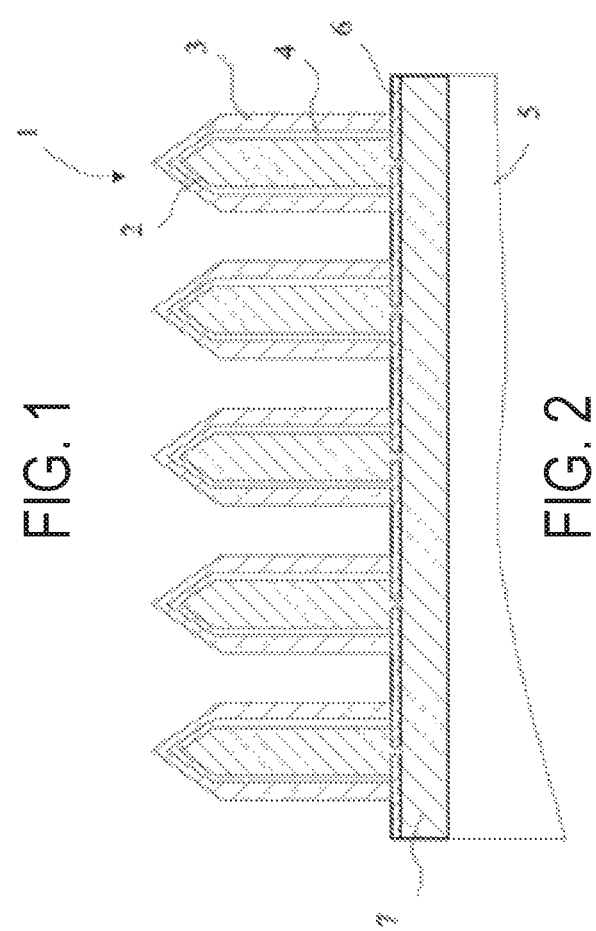

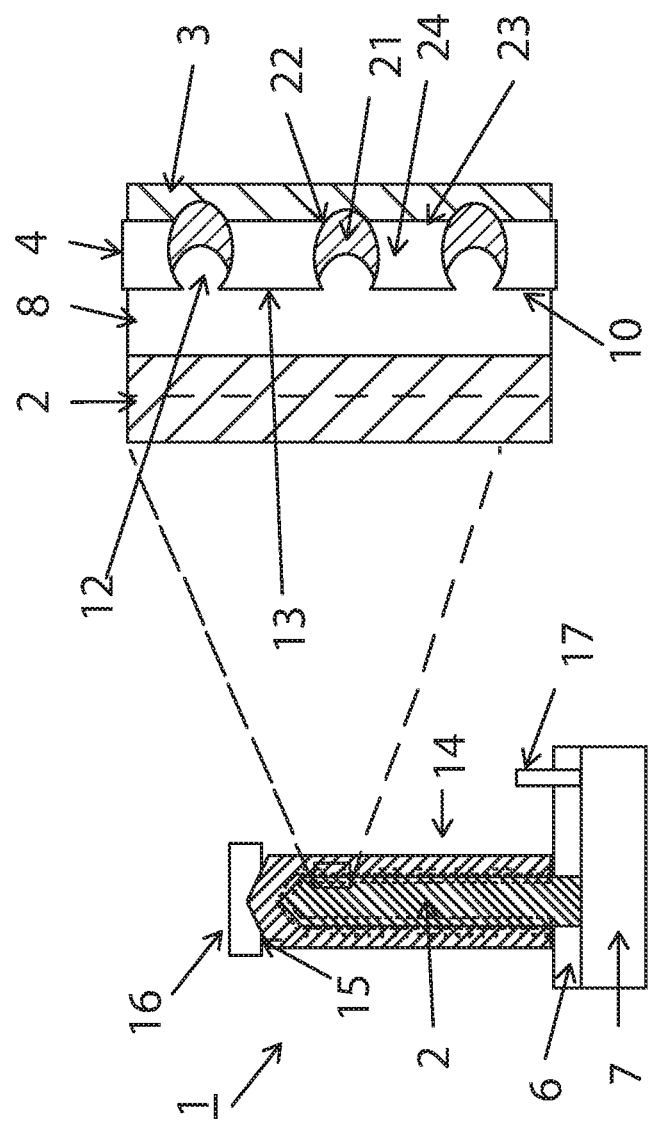

| Spectrum | In stats. | Al | Ga | In |
|---|---|---|---|---|
| 1 | Yes | 2.0 | 77.4 | 20.5 |
| 2 | Yes | 0.7 | 81.9 | 17.5 |
| 3 | Yes | 0.5 | 79.6 | 19.9 |
| 4 | Yes | 31.2 | 69.1 | -0.3 |
| 5 | Yes | 13.1 | 85.7 | -0.8 |
| 6 | Yes | 9.9 | 90.0 | 0.1 |
| 7 | Yes | -0.1 | 76.2 | 23.9 |
| Mean | | 8.5 | 80.0 | 11.6 |
| Std. deviation | | 11.6 | 6.8 | 11.3 |
| Max. | | 31.2 | 90.0 | 23.9 |
| Min. | | -0.1 | 69.1 | -0.8 |

… # III-NITRIDE NANOWIRE LED WITH STRAIN MODIFIED SURFACE ACTIVE REGION AND METHOD OF MAKING THEREOF

This application is a continuation of U.S. application Ser. No. 14/570,521, filed Dec. 15, 2014, which is claim benefit of priority of U.S. Provisional Application No. 61/917,046, filed Dec. 17, 2013, the entire contents of both which is incorporated herein by reference.

FIELD

The embodiments of the invention are directed generally to semiconductor devices, such as nanowire light emitting diodes (LED), and specifically to nanowire LEDs with a non-uniform active region.

BACKGROUND

Nanowire light emitting diodes (LED) are of increasing interest as an alternative to planar LEDs. In comparison with LEDs produced with conventional planar technology, nanowire LEDs offer unique properties due to the one-dimensional nature of the nanowires, improved flexibility in materials combinations due to less lattice matching restrictions and opportunities for processing on larger substrates.

U.S. Pat. No. 8,138,493 issued on Mar. 20, 2012, which is incorporated herein by reference in its entirety, notes that it is difficult to fabricate light emitting diodes in the infra-red to green wavelength region using conventional planar technology in the GaN system and these give much lower efficiency than blue color emitting LEDs. This can be attributed to that: a) a miscibility gap for an InGaN material in the red and green wavelength region since $In_xGa_{1-x}N$ with approximately $0.4<x<0.8$ is not theoretically expected to be a stable material; and b) the high inherent defect density of the planar layers of the LED structure reduces photonic recombination efficiency by a much higher degree for high In content InGaN than low In content InGaN that is used in blue LEDs. The U.S. Pat. No. 8,138,493 solves this problem by providing a nanostructured LED device comprising InGaN quantum dots between a nanowire core and a nanowire shell that provide light emission in the infra-red to green wavelength region with improved emission. By way of example one such nanostructured LED device comprises a nanowire core made of GaN and InGaN quantum dots embedded in a GaN based shell.

SUMMARY

An embodiment of the invention provides a light emitting diode (LED) device and a method of making the LED device. The device includes a semiconductor nanowire core and an In(Al)GaN active region quantum well shell located radially around the semiconductor nanowire core. In one embodiment, the active quantum well shell contains indium rich regions having at least 5 atomic percent higher indium content than indium poor regions in the same shell. In another embodiment, the active region quantum well shell has a non-uniform surface profile having at least 3 peaks. Each of the at least 3 peaks is separated from an adjacent one of the at least 3 peaks by a valley, and each of the at least 3 peaks extends at least 2 nm in a radial direction away from an adjacent valley.

BRIEF DESCRIPTION OF THE DRAWINGS

FIG. 1 schematically illustrates a side cross sectional view of a basis of a nanowire LED.

FIG. 2 schematically illustrates a side cross sectional view of a nanowire LED structure on a buffer layer.

FIG. 4 schematically illustrates a side cross sectional view of a nanowire LED device in which the active region shell is formed on a non-uniform radial surface and contains indium rich regions.

DETAILED DESCRIPTION OF THE EMBODIMENTS OF THE INVENTION

Figure 3A:
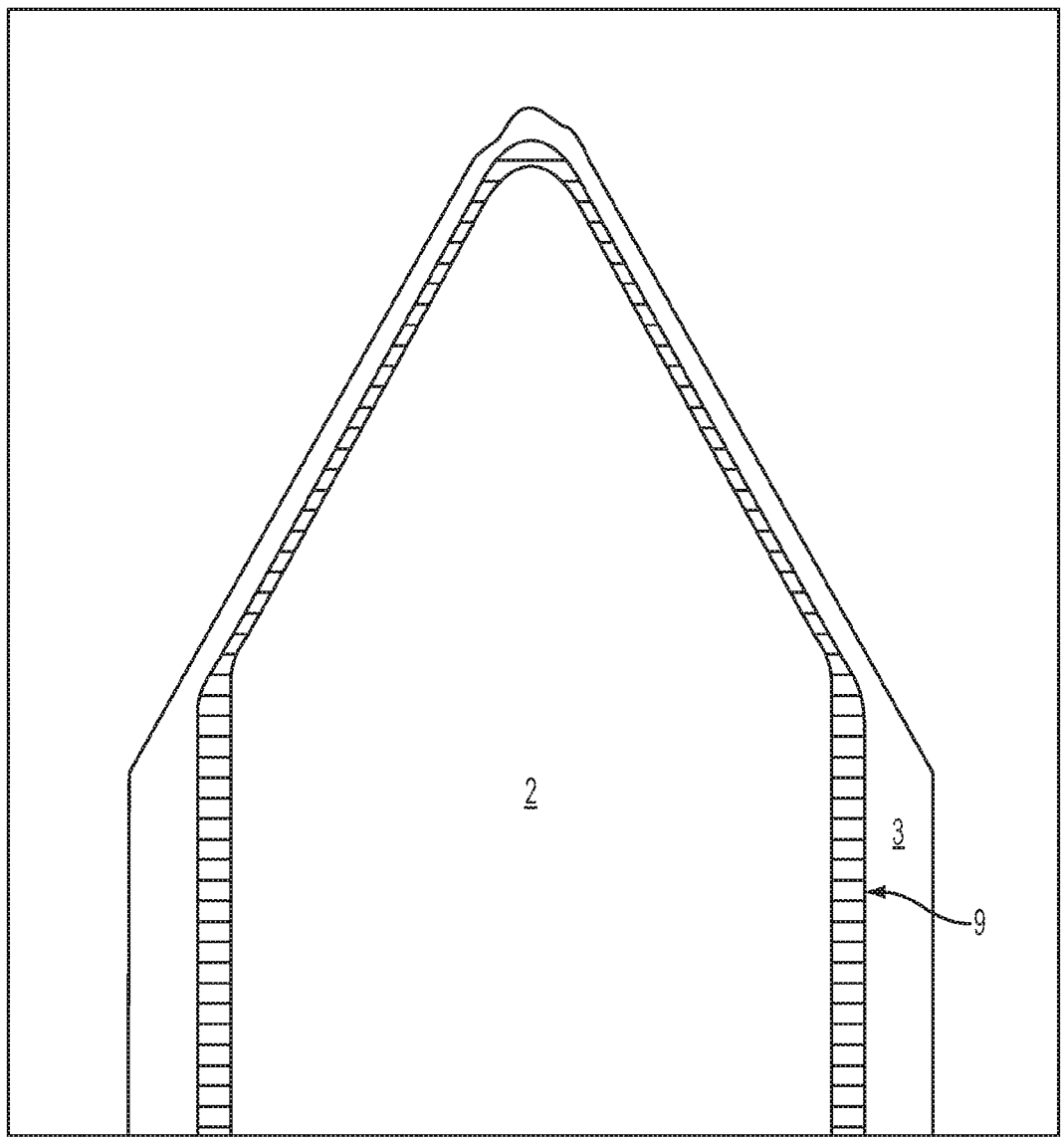
FIGS. 3A and 3B are formal line drawings of electron microscope micrographs of a nanowire LED device in which the active region shell is formed on a smooth, uniform radial surface.

In one embodiment, the active region shell is formed on a non-uniform surface such that the active region shell has a non-uniform profile (e.g., a non-straight radial sidewall and/or a non-uniform thickness in the horizontal direction as a function of height in the vertical direction). This "bumpy" surface reduces or eliminates the defects (e.g., stacking faults) in the outer shell.

The formation of the active region shell comprising one or more In(Al)GaN/(Al)GaN quantum wells on a non-uniform surface causes indium rich In(Al)GaN regions (e.g., InGaN or InAlGaN regions having more than 10 atomic percent indium, such as 15 to 35 atomic percent indium) to be formed by self assembly during the formation of the active region. These indium rich regions are believed to be responsible for high brightness, high efficiency emission in the longer wavelength spectral region (e.g., green to yellow 495-590 nm peak emission wavelength region and/or orange to red 591-650 nm peak emission wavelength region) depending on the indium content of the regions.

However, in contrast to separately formed quantum dots which are separately formed between portions of the active region shell, the indium rich regions are integrally formed in-situ during the formation of the active region shell. Thus, the indium rich regions comprise integral portions of the active region quantum well shell rather than discrete nanoparticles or quantum dots embedded in the active regions quantum well shell. For example, discrete nanoparticles often have a different grain structure and/or orientation than the surrounding semiconductor layer, and a sharp transition or grain boundary between the nanoparticle and surrounding layer grains, visible in an electron microscopy micrograph. In contrast, the integral indium rich regions do not necessarily have a different crystal orientation than the surrounding indium poor regions of the surrounding active region shell and do not necessarily have a sharp transition or grain boundary.

For example, InGaN active regions containing about 10 atomic percent indium emit light with a peak wavelength of about 450 nm in the blue spectral range, InGaN active regions containing about 20 atomic percent indium emit light with a peak wavelength of about 520 nm in the green spectral range, and InGaN active regions containing about 30 atomic percent indium emit light with a peak wavelength of about 610 nm in the red spectral range. Of course the indium concentration in the In(Al)GaN active region can be varied between 5 atomic percent and 35 atomic percent, such as 15 to 30 atomic percent, to achieve the desired color emission (e.g., blue, green, yellow, orange or red) between about 430 nm and about 650 nm, such as 450 to 620 nm.

It should be noted that the indium rich In(Al)GaN regions may be formed in the active region quantum well without using the non-uniform surface under the quantum well as long as the quantum well itself has a non-uniform thickness (i.e., is a bumpy radial quantum well shell).

Large (about 10%) lattice mismatch between InN (a=0.354 nm) and GaN (a=0.319 nm) makes it difficult to incorporate high concentrations of indium in the GaN lattice without causing structural defects in a resulting InGaN layer. However, by forming the indium rich In(Al)GaN regions in an indium poor (e.g., having 10 atomic percent or less, such as 5-10 at. % indium) active region In(Al)GaN quantum well, such as a radial quantum well parallel to m-plane (i.e., vertical plane) of the GaN/InGaN core/radial shell nanowire, the structural defects in the resulting InGaN active region shell can be reduced.

One embodiment of the invention includes a series of nanometer-scale discontinuities along the m-plane to enhance the deposition of the indium along the length of the nanowire in the In(Al)GaN active region shell. This results in "bumpy" surface composed of nanometer scale peaks (comprising the indium rich regions) and valleys (comprising the indium poor regions) along the m-plane instead of maintaining a straight quantum well surface parallel to the m-plane. For example, in this "bumpy" surface the nanoscale features project at least partially along the diagonal p-plane, 10-11, from the vertical portion of the active region quantum well which is parallel the m-plane.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. The nanowires can have a diameter or width of up to about 2 micron. The small size of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature may be associated with an elongated shape. Since nanowires may have various cross-sectional shapes, the diameter is intended to refer to the effective diameter. By effective diameter, it is meant the average of the major and minor axis of the cross-section of the structure.

All references to upper, top, lower, downwards etc. are made as considering the substrate being at the bottom and the nanowires extending upwards from the substrate. Vertical refers to a direction perpendicular to the plane formed by the substrate, and horizontal to a direction parallel to the plane formed by the substrate. This nomenclature is introduced for the easy of understanding only, and should not be considered as limiting to specific assembly orientation etc.

Any suitable nanowire LED structure as known in the art may be used in the methods of the invention. Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

FIG. 1 schematically illustrates the basis for a nanowire LED structure that is modified in accordance with embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being made up from nanowire LEDs 1 having an n-type nanowire core 2 and a p-type shell 3 at least partly enclosing the nanowire core 2 and an intermediate active region 4, which may comprise a single intrinsic or lightly doped (e.g., doping level below $10^{16}$ $cm^{-3}$) semiconductor layer or one or more quantum wells, such as 3-10 quantum wells comprising a plurality of semiconductor layers of different band gaps. However, for the purpose of embodiments of the invention nanowire LEDs are not limited to this. For example the nanowire core 2, the active region 4 and the p-type shell 3 may be made up from a multitude of layers or segments. In alternative embodiments, only the core 2 may comprise a nanostructure or nanowire by having a width or diameter below 2 micron, while the shell 3 may have a width or diameter above one micron.

The III-V semiconductors are of particular interest due to their properties facilitating high speed and low power electronics and optoelectronic devices such as lasers and LEDs. The nanowires can comprise any semiconductor material, and suitable materials for the nanowire include but are not limited to: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$ $cm^{-3}$. A person skilled in the art is though familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductor (e.g., InP, GaAs). In order to function as a LED, the n-side and p-side of each nanowire LED 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited.

For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified by the "pyramid" facets and the vertical sidewall facets. The LEDs can be fabricated so that the emission layer formed on templates with dominant pyramid facets or sidewall facets. The same is true for the contact layer, independent of the shape of the emission layer.

FIG. 2 illustrates an exemplary structure that provides a support for the nanowires. By growing the nanowires on a growth substrate 5, optionally using a growth mask, or dielectric masking layer, 6 (e.g., a nitride layer, such as silicon nitride dielectric masking layer) to define the position and determine the bottom interface area of the nanowires, the substrate 5 functions as a carrier for the nanowires that protrude from the substrate 5, at least during processing. The bottom interface area of the nanowires comprises the root area of the core 2 inside each opening in the dielectric masking layer 6. The substrate 5 may comprise different materials, such as III-V or II-VI semiconductors, Si, Ge, Al$_2$O$_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowire cores 2 are grown directly on the growth substrate 5.

Preferably, the substrate 5 is also adapted to function as a current transport layer connecting to the n-side of each nanowire LED 1. This can be accomplished by having a substrate 5 that comprises a semiconductor buffer layer 7 arranged on the surface of the substrate 5 facing the nanowire LEDs 1, as shown in FIG. 2, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN.

The method described in the U.S. Pat. No. 7,829,443 patent includes providing the growth mask 6 on a support (e.g., on the buffer layer 7). Openings are then formed in the growth mask 6 to expose the buffer layer. The openings are preferably well controlled, both in regards to their diameter and their relative positioning. Several techniques known in the art can be used for the procedure including, but not limited to electron beam lithography (EBL), nanoimprint lithography, optical lithography and reactive ion etching (ME) or wet chemical etching methods. Preferably the openings are about 75-125 nm, such as about 100 nm in diameter and pitched 0.5-5 μm apart. The openings define the position and the diameter of the nanowire cores 2 to be produced.

Then, the nanowire cores 2 are grown by a CVD based process where the precursor source flows are continuous. The precursor source flow rates are adjusted to achieve a low supersaturation in the growth zone. The V/III-ratio should be 100 or less, such as in the range of 1-100, preferably in the range of 1-50, and even more preferably in the range of 5-50. It should be noted that this VIII-ratio is considerably lower than the ratios used for bulk film growth. In other words, the nanowire cores 2 are grown at a low V/III ratio at a relatively low temperature (e.g., below 800 C).

Then, one or more shells 3, 4 shown in FIGS. 1 and 2 are grown on the core 2 by increasing the temperature above 800 C, such as 900-1200 C, and increasing the V/III ratio to a higher amount than that used for the core growth (e.g., a V/III ratio higher than 100, such as 200-1000). For example, the n-GaN nanowire core 2 may be grown by MOCVD using ammonia and TMG (trimethylgallium) gas sources and an optional doping source gas (e.g., a Mg containing source gas). The NH$_3$ flow rate may be 0.2 to 3.0 sccm during core 2 growth and 50-100 sccm during shell 3, 4 growth. TMG (trimethylgallium) flow rate may be between 0.12 and 1.2 μmol/min.

If desired, an intermediate n-GaN shell 8 may be formed on the n-GaN core 2 before forming the active region shell 4. The n-GaN shell 8 may be formed at the high temperature (above 800 C, such as 900-1200 C) and high V/III ratio higher than 100, such as 200-1000. This shell 8 is shown in FIGS. 3A and 3B and has a smooth (i.e., straight) outer sidewall (i.e., the m-plane radial sidewall).

Figure 3B:
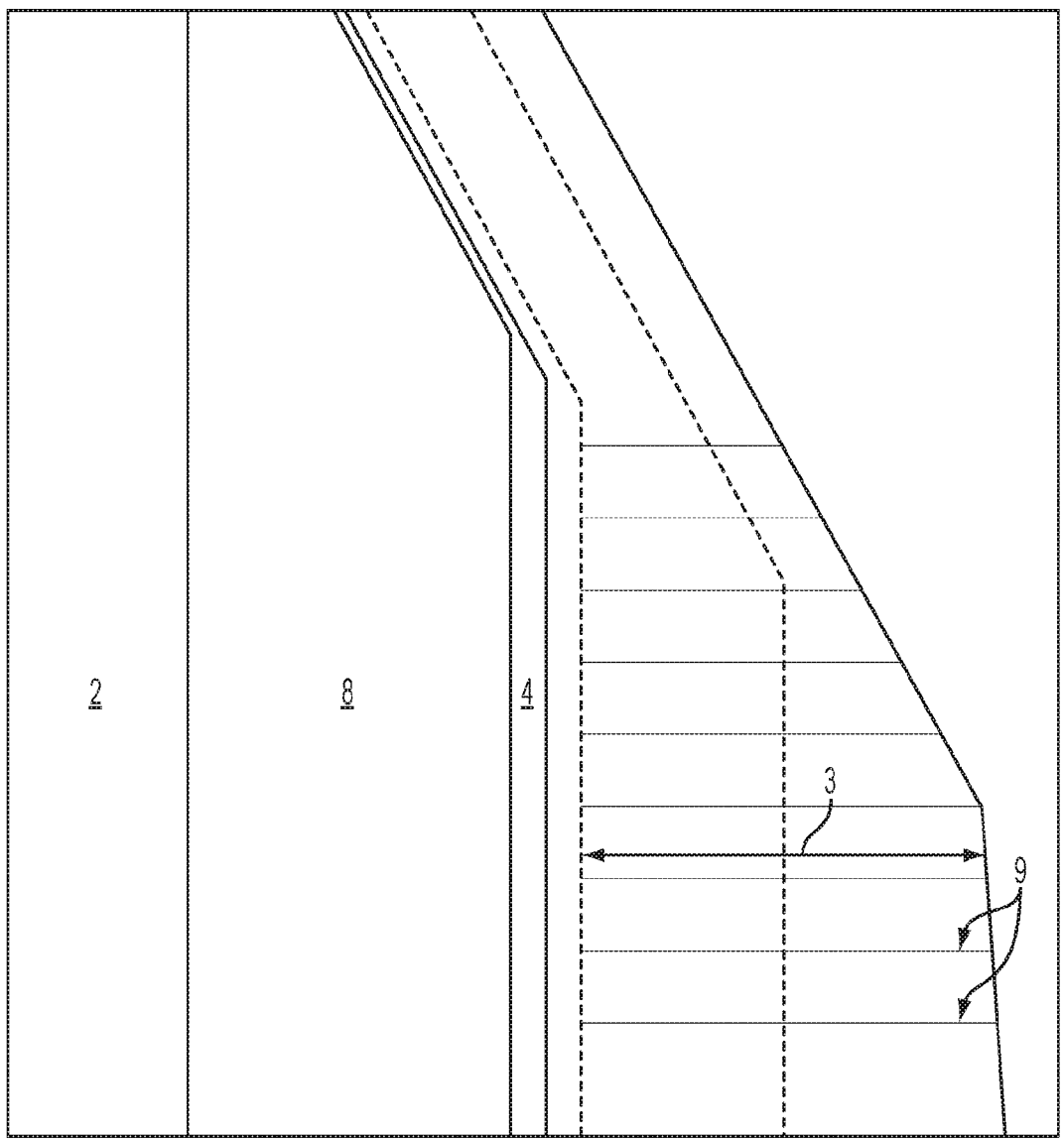

In one embodiment, when the quantum well active region shell 4 is formed on a smooth radial surface of the intermediate n-GaN shell 8, a number of defects, which are believed to be horizontal stacking faults 9, are formed in an outer shell 3 (e.g., a p-type GaN and/or AlGaN shell) which surrounds the active region shell 4, as shown in FIGS. 3A and 3B.

Thus, in one embodiment illustrated in FIG. 4, the active region shell is formed on a non-uniform (e.g., "bumpy") surface such that the active region shell 4 has a non-uniform profile and the localized indium rich In(Al)GaN regions 21. The "bumpy" surface can be initiated in the underlayer 8 under (e.g., radially inward from) the active region quantum well shell 4, such as in the intermediate shell or in a barrier layer underneath the active region quantum well shell 4. This forms a strain modified surface active region shell 4. Preferably, the underlayer 8 has a lower indium content than the active region quantum well 4 (i.e., underlayer 8 has a wider band gap than active region quantum well 4) to avoid absorbing the quantum well emission. For example, the underlayer 8 may have no indium (e.g., consist of GaN or AlGaN) or it may comprise an InGaN or InAlGaN underlayer having less than 10 at. % indium such as 1-5 at. % indium.

By controlling the bumpiness of the underlayer 8, a more homogeneous, high indium content active quantum well layer(s) 4 can be subsequently grown without introducing defects. The degree of bumpiness of the underlayer 8 can be controlled by the growth conditions, such as temperature, MOCVD pressure, MOCVD reactant flow rates and/or the In/Ga ratio of the underlayer. For example, the degree of bumpiness increases with increasing indium content and a lower growth temperature.

The bumpiness and growth conditions of the underlayer 8 may control the composition of the quantum well active region 4 from homogeneous to the creation of discreet indium rich regions embedded in an In(Al)GaN quantum well of lower indium content. The thickness of the quantum well would be similar to or less than the peak-valley height described below.

While a single quantum well active region 4 is shown in FIG. 4, a multiple quantum well active region 4 may also be formed. Separating the bumpy quantum wells 4 with a bumpy GaN or lower In content InGaN or InAlGaN barrier layers provides the growth of a multiple quantum well active region 4 structure on the outer shell 8 of the nanowires with decreased amount of defects and with each quantum well having localized indium rich regions 21.

For example, the non-uniform surface or profile in the underlayer 8 and/or in the active region shell 4 may have a peak 12 to adjacent valley 13 separation of 10 to 30 nm, and peak 12 to adjacent valley 13 depth (i.e., variation in thickness) of 3 to 5 nm. Preferably, the active layer region shell 4 has a thickness greater than 5 nm to avoid producing stacking faults. If the underlayer 8 has more than 15% indium, then it also preferably has a thickness greater than 5 nm to avoid producing stacking faults.

As used herein, a non-uniform surface means a non-straight or non-smooth (i.e., bumpy or rough) surface, with at least 3 peaks (e.g., bulges) 12 extending at least 2 nm, such as 3 to 5 nm away from at least one valley (e.g., recess) 13 in the radial (i.e., m-plane) surface along the horizontal direction. A non-uniform profile means that the quantum well(s) in the active region shell have a non-straight radial surface (i.e., sidewall) and/or a non-uniform thickness along the radial (i.e., horizontal) direction as a function of height in the vertical direction. A non-uniform thickness means that the radial (i.e., horizontal) thickness of the active region shell (e.g., quantum well) 4 varies by at least 15%, such as by 20-40% at different vertical positions in the shell 4 and have roughly non-parallel radial sidewalls.

Increasing the film thickness of In-containing bumpy layers (e.g., the active region shell) above 5 nm will disproportionately deposit indium on the peaks 12 compared to the valleys 13 and form localized indium rich In(Al)GaN regions 21 in the active region shell 4 on the peaks 12 in the underlayer 8. As shown in FIG. 4, the indium rich regions 21 in the active region shell 4 correspond to the peaks 22 in the active region shell 4, and the indium rich regions 21 are separated by the indium poor regions 24 corresponding to the valleys 23 in the active region shell 4. Preferably, the difference in indium content between the indium rich and indium poor regions in shell 4 is at least 5 atomic percent, such as 10 to 25 atomic percent.

This results in an inhomogeneous active layer 4 which can yield multiple emission peaks if the electrical contact is put directly on the m-plane 14 of the nanowire. As shown in FIG. 4, preferably the p-side electrical contact 16 to the p-type GaN shell 3 is made on the sloped p-plane 15 at the tip of the shell 3, while the n-side electrical contact 17 is made to the c-plane of the n-type GaN nanowire core 2 through the n-type GaN or AlGaN substrate 7. Thus, the lower emission peaks coming from the m-plane 14 are not visible in the EL spectrum. Therefore, the volume of high In content material (i.e., regions 21) that emits longer wavelength green, yellow, orange or red light can increase without introducing the deleterious stacking fault defects.

Figure 5A:
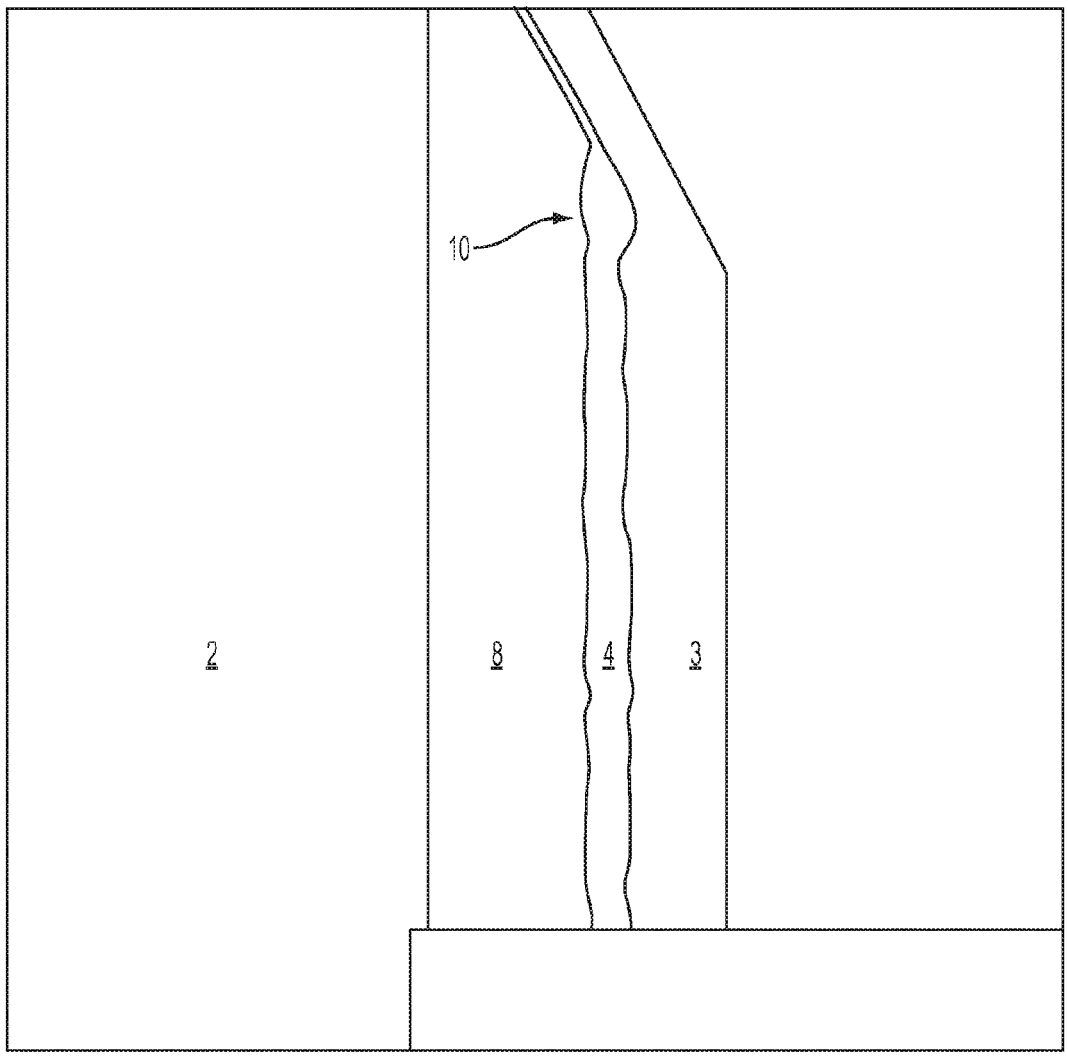
FIGS. 5A, 5B, 6B, 7B and 8 are formal line drawings of electron microscope micrographs of a nanowire LED device shown in FIG. 4.
Figure 5B:
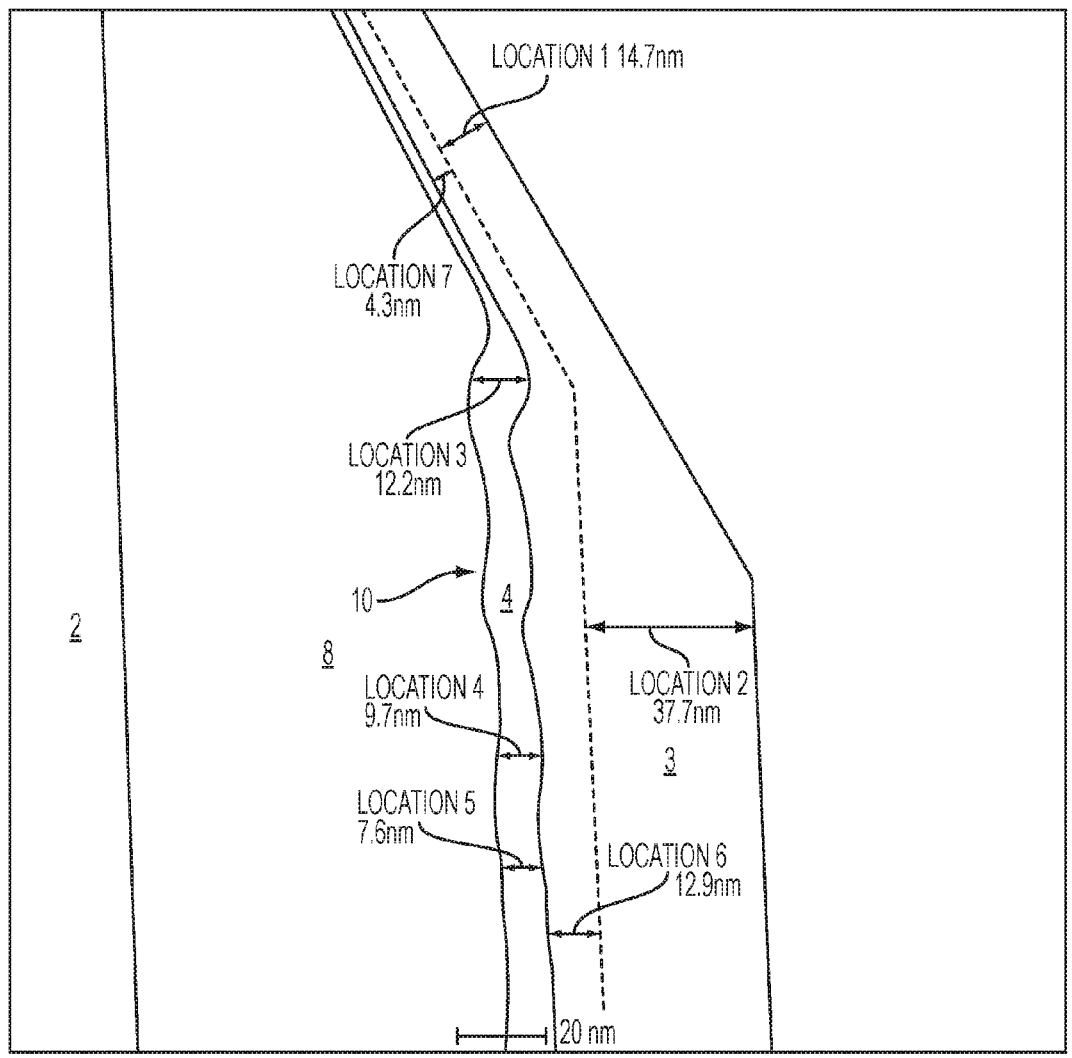

For example, as shown in FIGS. 5A and 5B, the non-uniform surface may be achieved by forming the intermediate shell 8 at a low temperature (e.g., 800 C or below), while maintaining the high V/III ratio. This causes the outer radial surface 10 of the intermediate shell 8 to become non-uniform. The active region shell 4 and the outer p-type shell (or shells) 3 are then formed over the intermediate shell 8. As can be seen in FIGS. 5A and 5B, this growth on a non-uniform surface produces the active regions shell 4 with the non-uniform profile and reduces or eliminates the defects (e.g., stacking faults) 9 in the outer shell(s) 3.

As shown in FIGS. 5A and 5B, the active region shell 4 has a non-uniform thickness. For example, the quantum well containing shell 4 has a thickness that ranges from 7.6 nm at location #5 to 12.2 nm at location #3. Thus, the shell 4 radial thickness varies by over 30% (i.e., 30-38%) and by over 4 nm along the vertical direction.

Figures 6A, 6B:
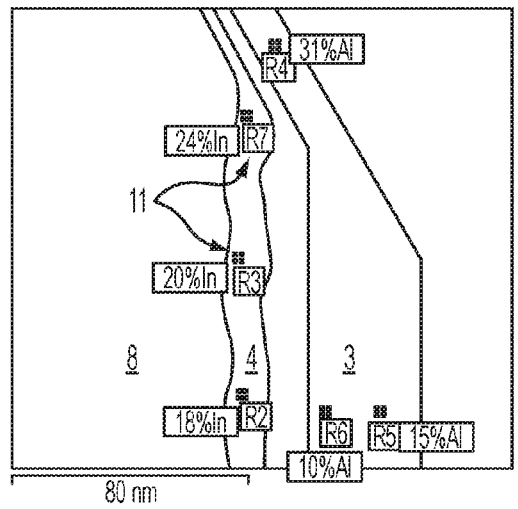
FIGS. 6A and 7A are tables showing the composition of selected regions in respective FIGS. 6B and 7B.
Figures 7A, 7B:
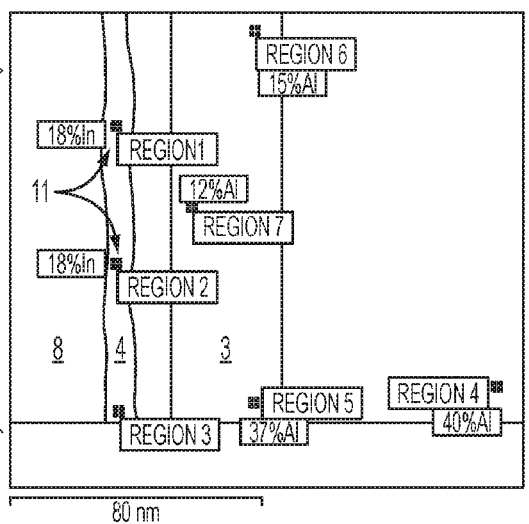

The formation of the active region shell 4 with the non-uniform profile comprising one or more InGaN/GaN quantum wells on the non-uniform surface 10 results in localized indium rich InGaN regions 21 being formed by self assembly during the formation of the active region shell. Specifically, it is believed that the regions 21 are formed in the thicker (i.e., bulging) regions of the active region shell 4. FIGS. 6A and 7A illustrate tables showing Al, Ga, and In content in atomic percent in various locations of the nanowire LEDs shown in respective FIGS. 6B and 7B. As shown in FIGS. 6A and 6B, regions # 1, 2, 3 and 7 in the InGaN/GaN quantum well active regions 4 contain over 15 atomic percent indium, such as 17.5 to 23.9 at % indium (i.e., 20.5, 17.5, 19.9 and 23.9, respectively). Thus, indium concentration varies by over 5 atomic percent (e.g., 5 to 6.4 atomic percent) between regions # 2 and 7. Regions # 4-6 are located in the AlGaN outer shell(s) and have no indium and a variable concentration of aluminum.

As shown in FIGS. 7A and 7B, regions # 1, 2 and 3 in the InGaN/GaN quantum well active regions 4 contain over 14 atomic percent indium, such as 14.1 to 18.3 at % indium (i.e., 18.0, 18.3 and 14.1, respectively). Thus, indium concentration varies by over 4 atomic percent between regions # 2 and 3. Regions # 4-7 are located in the AlGaN outer shell(s) and have no indium and a variable concentration of aluminum.

These indium rich regions 21 are believed to be responsible for high brightness, high efficiency emission in the green to yellow wavelength spectral region.

Furthermore, the formation of the active region shell 4 on the non-uniform surface 10 is believed to result in a much greater thickness of the active region 4 on the radial surfaces (i.e., the non-polar {10-10} m-plane) than on the pyramidal, slanted upper surfaces (i.e., the semi-polar {1-101} p-plane) of the intermediate shell 8. The radial thickness of the active region shell 4 over the m-plane of the intermediate shell 8 is at least 3 times, such as 3-10 times thicker than the thickness over the p-plane, 10-11, of the intermediate shell 8 at the top of the device. This improves the LED device performance because of the improved emission from the m-plane portions of the InGaN quantum wells compared to the emission from the p-plane, 10-11, portions of the same quantum wells. Thus, the increased m-plane thickness of the quantum wells compared to their p-plane, 10-11, thickness means that a higher ratio of radiation is emitted from the m-plane portion than the p-plane, 10-11, portion of the quantum wells than in the prior art devices with thicker p-plane, 10-11, portions of the quantum wells.

Figure 8:
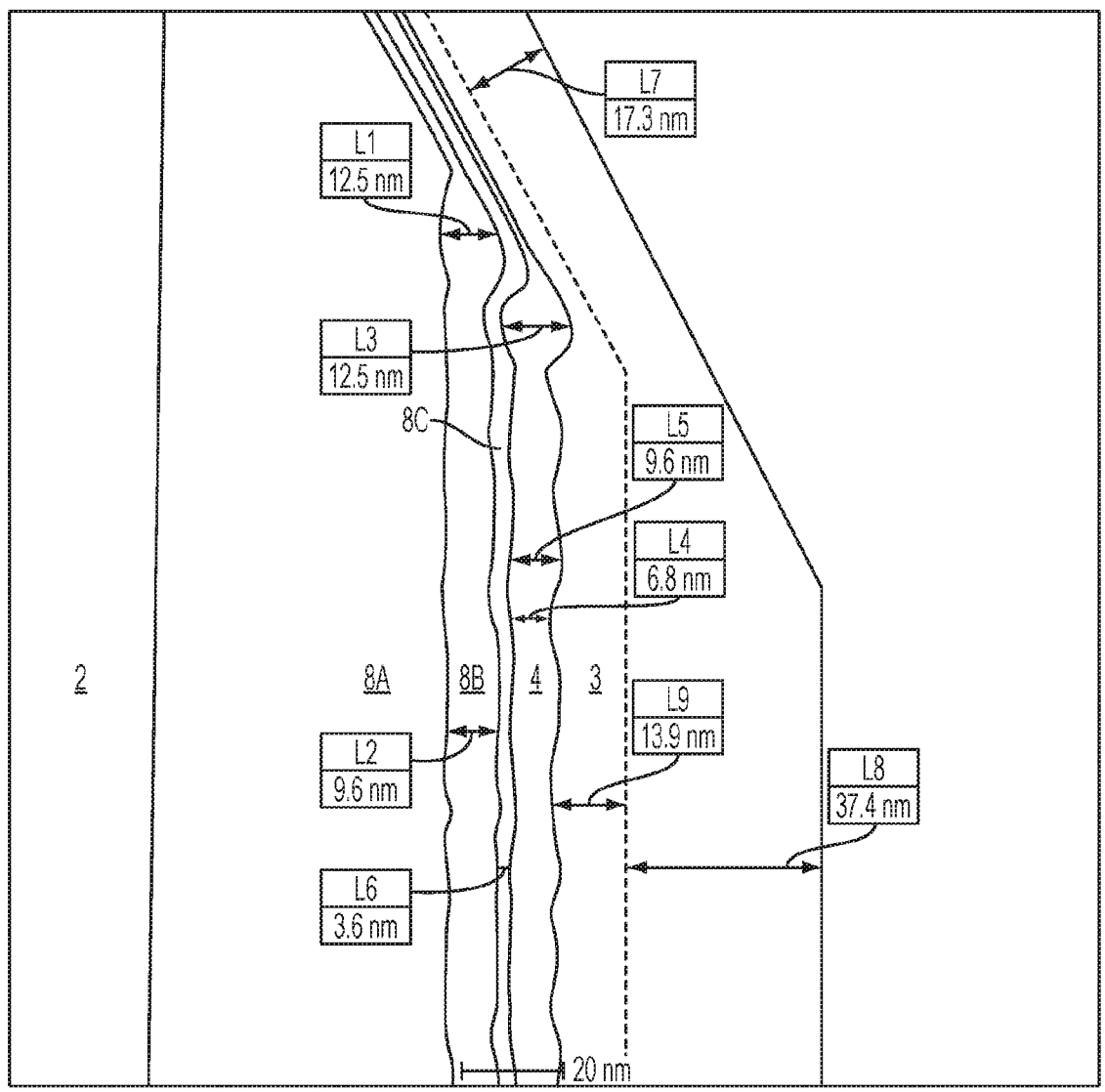

FIG. 8 illustrates an alternative embodiment of the invention. In this embodiment, the device contains three intermediate shells 8A, 8B and 8C. In interior intermediate shell 8A comprises an n-GaN shell. The middle shell 8B comprises an n-InGaN shell with a non-uniform surface and the outer shell 8C comprises a n-GaN shell with a non-uniform surface. Both shells 8B and 8C may be formed with the high V/III flow ratio and a low temperature (e.g., below 800 C) to form the non-uniform surface for growth of the active region shell 4 on the outer intermediate shell 8.

As shown in FIG. 8, the active region shell 4 has a non-uniform thickness. For example, the quantum well containing shell 4 has a thickness that ranges from 6.8 nm at location #4 to 12.5 nm at location #3. Thus, the shell 4 radial thickness varies by over 40% (i.e., 40-45.6%) and by over 5 nm (e.g., 5 to 5.7 nm).

Although the present invention is described in terms of nanowire LEDs, it should be appreciated that other nanowire based semiconductor devices, such as field-effect transistors, diodes and, in particular, devices involving light absorption or light generation, such as, photodetectors, solar cells, lasers, etc., can be implemented on any nanowire structures.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

What is claimed is:

1. A nanowire device, comprising:
a semiconductor nanowire core; and
a first semiconductor shell located radially around the semiconductor nanowire core,
wherein:
the first semiconductor shell has a non-uniform surface profile having at least 3 peaks;
each of the at least 3 peaks is separated from an adjacent one of the at least 3 peaks by a valley;
each of the at least 3 peaks extends at least 2 nm in a radial direction away from an adjacent valley including a respective indium poor region; and
each of the at least 3 peaks comprises a respective indium rich region having a greater concentration of indium than the indium poor regions of the adjacent valleys.

2. The device of claim 1, wherein the device comprises a light emitting diode (LED) device and the first semiconductor shell comprises an active region quantum well shell.

3. The device of claim 2, further comprising a second semiconductor shell located radially outside the first semiconductor shell.

4. A method of making nanowire device, comprising:
forming a semiconductor nanowire core; and
forming a first semiconductor shell located radially around the semiconductor nanowire core,
wherein:
the first semiconductor shell has a non-uniform surface profile having at least 3 peaks;
each of the at least 3 peaks is separated from an adjacent one of the at least 3 peaks by a valley;
each of the at least 3 peaks extends at least 2 nm in a radial direction away from an adjacent valley including a respective indium poor region; and
each of the at least 3 peaks comprises a respective indium rich region having a greater concentration of indium than the indium poor regions of the adjacent valleys.

5. The method of claim 4, wherein the device comprises a light emitting diode (LED) device and the first semiconductor shell comprises an active region quantum well shell.

6. The method of claim 5, further comprising forming a second semiconductor shell radially around the first semiconductor shell.

7. The device of claim 1, wherein the indium rich regions comprises integral portions of an indium gallium nitride active region quantum shell that laterally surround the semiconductor nanowire core.

8. The device of claim 1, further comprising an underlayer laterally surrounding the nanowire core having a bumpy surface, wherein strain within the first semiconductor shell is locally modified by bumpiness of the bumpy surface.

9. The device of claim 8, wherein the underlayer has a lesser indium concentration than the indium poor regions.

10. The device of claim 8, wherein the first semiconductor shell includes a material selected from InGaN and InAlGaN.

11. The device of claim 10, wherein the indium rich regions contain 15 to 30 atomic percent indium and the indium poor regions contain less than 10 atomic percent indium.

12. The device of claim 3, wherein:
the semiconductor nanowire core includes an n-doped gallium nitride semiconductor material; and
the second semiconductor shell includes a p-doped gallium nitride semiconductor material.

13. The method of claim 4, wherein the indium rich regions and the indium poor regions are formed by self-assembly during deposition of the first semiconductor shell.

14. The method of claim 4, wherein the indium rich regions are formed integrally with the indium poor regions in-situ during formation of an active region shell that includes the first semiconductor shell.

15. The method of claim 4, wherein the indium rich regions comprises integral portions of an indium gallium nitride active region quantum shell that laterally surround the semiconductor nanowire core.

16. The method of claim 4, further comprising forming an underlayer laterally surrounding the nanowire core having a bumpy surface around the nanowire core, wherein strain within the first semiconductor shell is locally modified by bumpiness of the bumpy surface.

17. The device of claim 16, wherein the underlayer has a lesser indium concentration than the indium poor regions.

18. The method of claim 4, wherein the first semiconductor shell includes a material selected from InGaN and InAlGaN.

19. The method of claim 18, wherein indium rich regions contain 15 to 30 atomic percent indium and the indium poor regions contain less than 10 atomic percent indium.

20. The method of claim 6, wherein:
the semiconductor nanowire core includes an n-doped gallium nitride semiconductor material; and
the second semiconductor shell includes a p-doped gallium nitride semiconductor material.

* * * * *